United States Patent
O'Meara et al.

(10) Patent No.: US 7,202,186 B2
(45) Date of Patent: Apr. 10, 2007

(54) METHOD OF FORMING UNIFORM ULTRA-THIN OXYNITRIDE LAYERS

(75) Inventors: David L O'Meara, Poughkeepsie, NY (US); Cory Wajda, Mesa, AZ (US); Anthony Dip, Cedar Creek, TX (US); Michael Toeller, Austin, TX (US); Toshihara Furukawa, Essex Junction, VT (US); Kristen Scheer, Milton, NY (US); Alessandro Callegari, Yorktown Heights, NY (US); Fred Buehrer, Poughquag, NY (US); Sufi Zafar, Briarcliff Manor, NY (US); Evgeni Gousev, Mahopac, NY (US); Anthony Chou, Beacon, NY (US); Paul Higgins, Harriman, NY (US)

(73) Assignees: Tokyo Electron Limited, Tokyo (JP); International Business Machines Corporation (IBM), Armonk, NY (US)

( * ) Notice: Subject to any disclaimer, the term of this patent is extended or adjusted under 35 U.S.C. 154(b) by 0 days.

(21) Appl. No.: 10/630,970

(22) Filed: Jul. 31, 2003

(65) Prior Publication Data
US 2005/0026459 A1 Feb. 3, 2005

(51) Int. Cl.
H01L 21/31 (2006.01)
H01L 21/469 (2006.01)
(52) U.S. Cl. ............ 438/786; 438/513; 438/775
(58) Field of Classification Search ............ 438/513, 438/775, 776, 777, 786, 791, 792
See application file for complete search history.

(56) References Cited

U.S. PATENT DOCUMENTS

| | | | |
|---|---|---|---|
| 5,264,396 A | 11/1993 | Thakur et al. | |
| 5,296,412 A | 3/1994 | Ohsawa | |
| 5,334,281 A | 8/1994 | Doerre et al. | |
| 5,817,581 A | 10/1998 | Bayer et al. | |
| 5,904,523 A * | 5/1999 | Feldman et al. | 438/263 |
| 5,997,642 A * | 12/1999 | Solayappan et al. | 118/50 |
| 6,090,723 A | 7/2000 | Thakur et al. | |
| 6,197,641 B1 | 3/2001 | Hergenrother et al. | |
| 6,245,616 B1 * | 6/2001 | Buchanan et al. | 438/287 |
| 6,255,230 B1 * | 7/2001 | Ikakura et al. | 438/765 |
| 6,258,731 B1 | 7/2001 | Ando | |
| 6,503,846 B1 * | 1/2003 | Niimi et al. | 438/776 |
| 6,825,518 B2 * | 11/2004 | Park et al. | 257/303 |
| 2001/0031562 A1 | 10/2001 | Raaijmakers et al. | |
| 2002/0102859 A1 | 8/2002 | Yoo | |

(Continued)

OTHER PUBLICATIONS

Liu, H. I. et al., "Self-limiting oxidation of Si nanowires," J. Vac. Sci. Technol. B, American Vacuum Society, vol. 11 (No. 6), p. 2532-2537, (Nov./Dec. 1993).

(Continued)

Primary Examiner—Phuc T. Dang
(74) Attorney, Agent, or Firm—Pillsbury Winthrop Shaw Pittman LLP

(57) ABSTRACT

Ultra-thin oxynitride layers are formed utilizing low-pressure processing to achieve self-limiting oxidation of substrates and provide ultra-thin oxynitride. The substrates to be processed can contain an initial dielectric layer such as an oxide layer, an oxynitride layer, or a nitride layer, or alternatively can lack an initial dielectric layer. The processing can be carried out using a batch type process chamber or a single-wafer process chamber.

30 Claims, 9 Drawing Sheets

U.S. PATENT DOCUMENTS

2002/0111001 A1    8/2002    Ahn et al.
2003/0138562 A1*   7/2003    Subramony et al. ..... 427/255.28

OTHER PUBLICATIONS

Liu, H. I. et al., "Self-limiting oxidation for fabricating sub-5 nm silicon nanowires," Appl. Phys. Letter, American Institute of Physics, vol. 64 (No. 11), p. 1383-1385, (Mar. 14, 1994).

Fukuda, Hiroshi et al., "Fabrication of silicon nanopillars containing polycrystalline silicon/insulator multilayer structures," Appl. Phys. Lett., American Institute of Physics, vol. 70 (No. 3), p. 333-335, (Jan. 20, 1997).

Roy, P. K. et al., "Gate Dielectrics," Bell Labs, p. 276-289.

J. Derrien, "SiO2 Ultra Thin Film Growth Kinetics as Investigated by Surface Techniques," Surface Science, North-Holland Publishing Company, pp. 32-46, (Jun. 1982).

C. Raisin et al., "Work Function Measurements During Growth of Ultra Thin Films of SiO2 on Characterized Silicon Surfaces," Solid-State Electronics, Pergamon Press Ltd., vol. 27 (No. 5), pp. 413-417, (May 1984).

Mahisha Kundu et al., "Effect of oxygen pressure on the structure and thermal stability of ultrathin Al2O3 films on Si (001)," Journal of Applied Physics, American Institute of Physics, vol. 91 (No. 1), pp. 492-500, (Jan. 1, 2002).

* cited by examiner

METHOD OF FORMING UNIFORM ULTRA-THIN OXYNITRIDE LAYERS

FIELD OF THE INVENTION

The present invention relates to semiconductor processing, and more particularly, to a method for forming uniform ultra-thin oxynitride layers.

BACKGROUND OF THE INVENTION

Thin oxide (e.g., $SiO_2$) and oxynitride (e.g., $SiO_xN_y$) layers are often used as dielectric layers at the Si surface of an integrated circuit. This is in part because of excellent electrical properties of the oxide and oxynitride layers, including high electron mobility and low electron trap densities. Semiconductor transistor technology is currently requiring oxide and oxynitride gate dielectric layers for conventional gate dielectric applications that are less than about 10–15 angstrom (A) thick, or as thin as 5–7 A for use as interface layers with high-dielectric constant materials (also referred to herein as high-k materials).

A native oxide layer that is typically a few angstrom thick, forms easily on clean Si surfaces, even at room temperature and atmospheric pressure. An oxide layer with a desired thickness that is larger than the native oxide thickness, can be grown through the native oxide layer, but usually the thickness uniformity and quality of the oxide layer is poor across the entire Si substrate.

Alternatively, the native oxide (or the chemical oxide) can be removed from a Si surface prior to growing a new oxide layer. The native oxide layer can, for example, be removed using liquid baths containing dilute hydrofluoric acid (HF) or by using HF gas phase etching. A new oxide layer can then be re-grown on the clean Si surface by conventional thermal oxidation, but the initial oxidation can proceed quickly and result in poor thickness uniformity and inadequate electrical properties. For ultra-thin (less than about 20 A) oxide layers used in transistor technologies, the leakage current is dominated by the tunneling current.

Si-oxynitride layers are viewed as one of the most promising alternate material to replace the $SiO_2$ gate oxide, while still being compatible with the Si technology. Thin oxynitride layers are usually formed either by thermal processing methods or by plasma-based methods. Nitridation of ultra-thin oxide layers, that results in the formation of oxynitride layers, has been shown to alleviate various limitations encountered with oxide layers. The improvements include increased resistance to boron penetration, lower tunneling leakage current and interface-state generation, and less threshold voltage shift under constant current conditions. The improved dielectric properties that are observed for oxynitride layers are attributed to the fact that the nitrogen atoms at the surface of the $SiO_2$/Si act as a barrier to boron penetration and can reduce strain at the $SiO_2$/Si interface.

SUMMARY OF THE INVENTION

A method is provided for forming ultra-thin oxynitride layers for gate dielectric applications, and other applications, such as dielectric interface layers underneath high-k materials. The method utilizes low partial pressure of a nitrogen-containing oxidizing gas and optionally an oxygen-containing gas, to achieve self-limiting oxidation of substrates that results in ultra-thin oxynitride layers.

In one embodiment of the invention, a substrate to be processed can be clean and lack an initial dielectric layer. Self-limiting oxidation of the substrate results in formation of an ultra-thin oxynitride layer on the substrate.

In an alternate embodiment of the invention, the substrate to be processed can contain an initial dielectric layer comprising at least one of an oxide layer, an oxynitride layer, and a nitride layer. The initial dielectric layer is used to control the growth of an ultra-thin oxynitride layer in a self-limiting oxidation of the substrate.

DETAILED DESCRIPTION OF THE INVENTION

A method is provided for forming ultra-thin oxynitride dielectric layers. The oxynitride layers find use in semiconductor microstructures, for example, as gate dielectrics and as dielectric interface layers located between high-k materials and the underlying substrates.

Figure 1A:
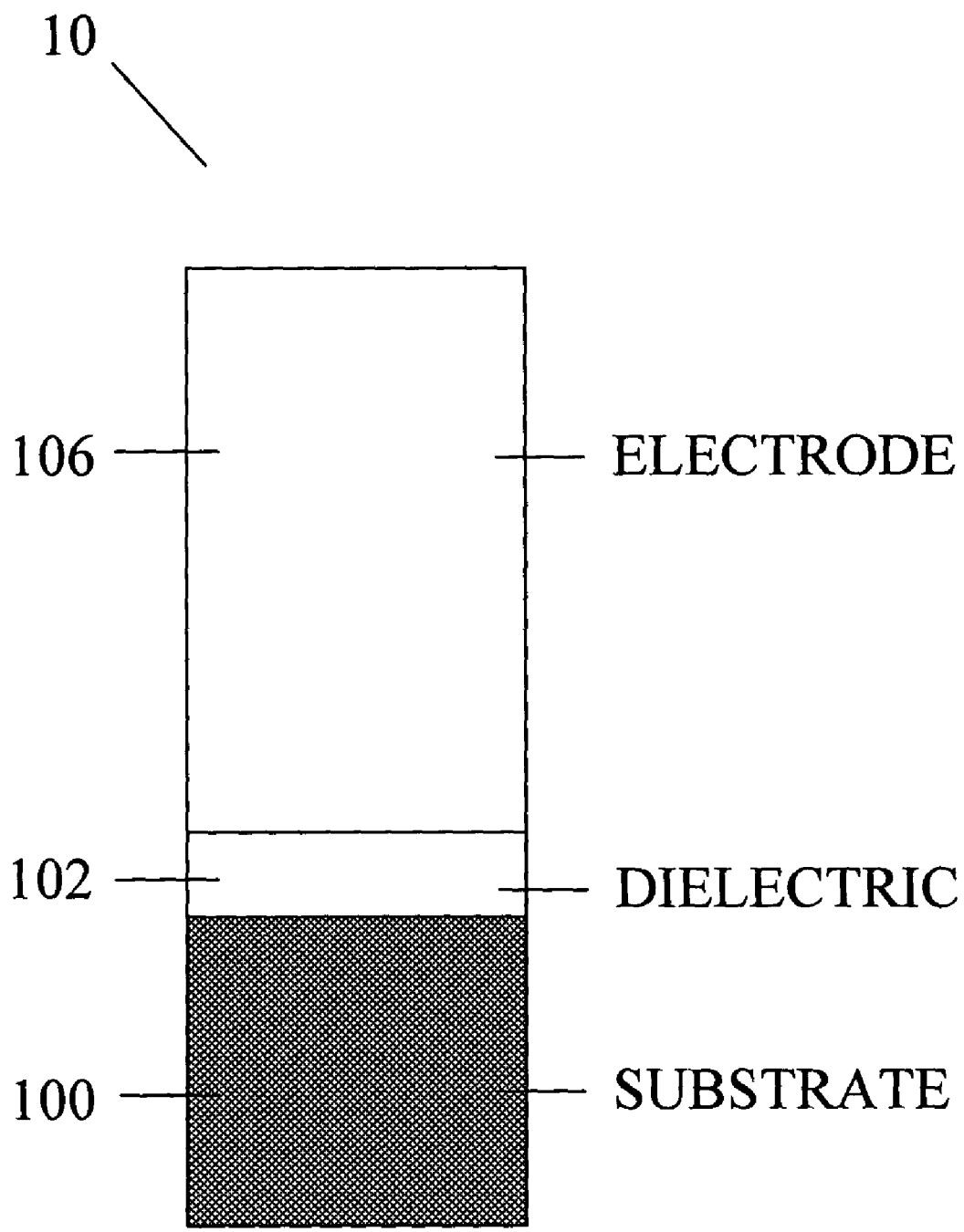
FIG. 1A schematically shows a cross-sectional view of a gate electrode microstructure.

FIG. 1A schematically shows a cross-sectional view of a gate electrode microstructure. The gate electrode microstructure 10, which can be a part of an integrated circuit, comprises a substrate 100, a dielectric layer 102, and an electrode layer 106. The substrate 100 can, for example, be a Si substrate that is single-crystal Si or polycrystalline-Si (poly-Si). A Si substrate can include numerous active devices and/or isolation regions (not shown). A Si substrate 100 can be of n- or p-type, depending on the type of device being formed, and can, for example, consist of a substrate of any diameter, such as a substrate with a diameter greater than about 195 mm, e.g., a 200 mm substrate, a 300 mm substrate, or an even larger substrate. In addition to the traditional doped poly-Si, the electrode layer 106 can, for example, comprise at least one of W, Al, TaN, TaSiN, HfN, HfSiN, TiN, TiSiN, Re, Ru, and SiGe.

The dielectric layer 102 overlying the substrate 100 can, for example, comprise at least one of an ultra-thin (less than about 20 A) oxide layer and an oxynitride layer. It should be noted that the term "oxide" includes oxidized materials containing oxygen that are typically used in semiconductor applications. Such materials include, for example, Si, that forms a $SiO_2$ dielectric layer upon oxidation. An oxide layer can be formed using thermal oxidation of the substrate in the presence of a process gas that comprises an oxygen-containing gas, e.g., $O_2$, $O_3$, $H_2O$, and $H_2O_2$.

The term "oxynitride" includes oxidized materials containing oxygen and nitrogen. Such materials include, for example, Si-oxynitride, that forms $SiO_xN_y$ in an oxidation process that includes nitrogen-incorporation. An oxynitride layer is commonly formed using a process gas comprising a nitrogen-containing oxidizing gas containing at least one of NO, $N_2O$, and $NH_3$. For example, high quality $SiO_xN_y$ layers can be formed using rapid thermal nitrous oxide (RTNO) treatment of Si surfaces. Alternatively, oxynitride layers can be formed using plasma nitridation methods, including remote plasma nitridation (RPN) of oxide layers.

Nitrogen-content and nitrogen distribution within an oxynitride layer can influence the device performance. Oxynitride layers can have an isotropic distribution of nitrogen and oxygen atoms, or alternatively, the atom distribution can be anisotropic. Nitrogen incorporation into oxide layers is used to increase the dielectric constant of the oxide layers, to control Si surface oxidation, and to act as a barrier layer to prevent diffusion of atoms through the different layers. Increasing the dielectric constant can reduce the leakage current that is observed when compared to an oxide layer having the same capacitance.

In current semiconductor devices, one function of gate dielectric layers is to "gate" the electrons, by controlling the flow of electricity across the transistor. With the introduction of high-k materials, these layers will likely still be required at the channel and/or gate electrode to preserve interface state characteristics. This includes forming an interface with good electrical properties, preventing uncontrolled Si surface oxidation, reducing reactions between different layers, and acting as a barrier layer to prevent diffusion of atoms to the different layers (e.g., dopant penetration from the gate electrode 106 into the substrate 100). In practice, in order to achieve good device performance, it is important to control the thickness of the dielectric layer 102, such that it remains thin, thereby avoiding increasing the equivalent oxide thickness (EOT) of the gate electrode microstructure.

Figure 1B:
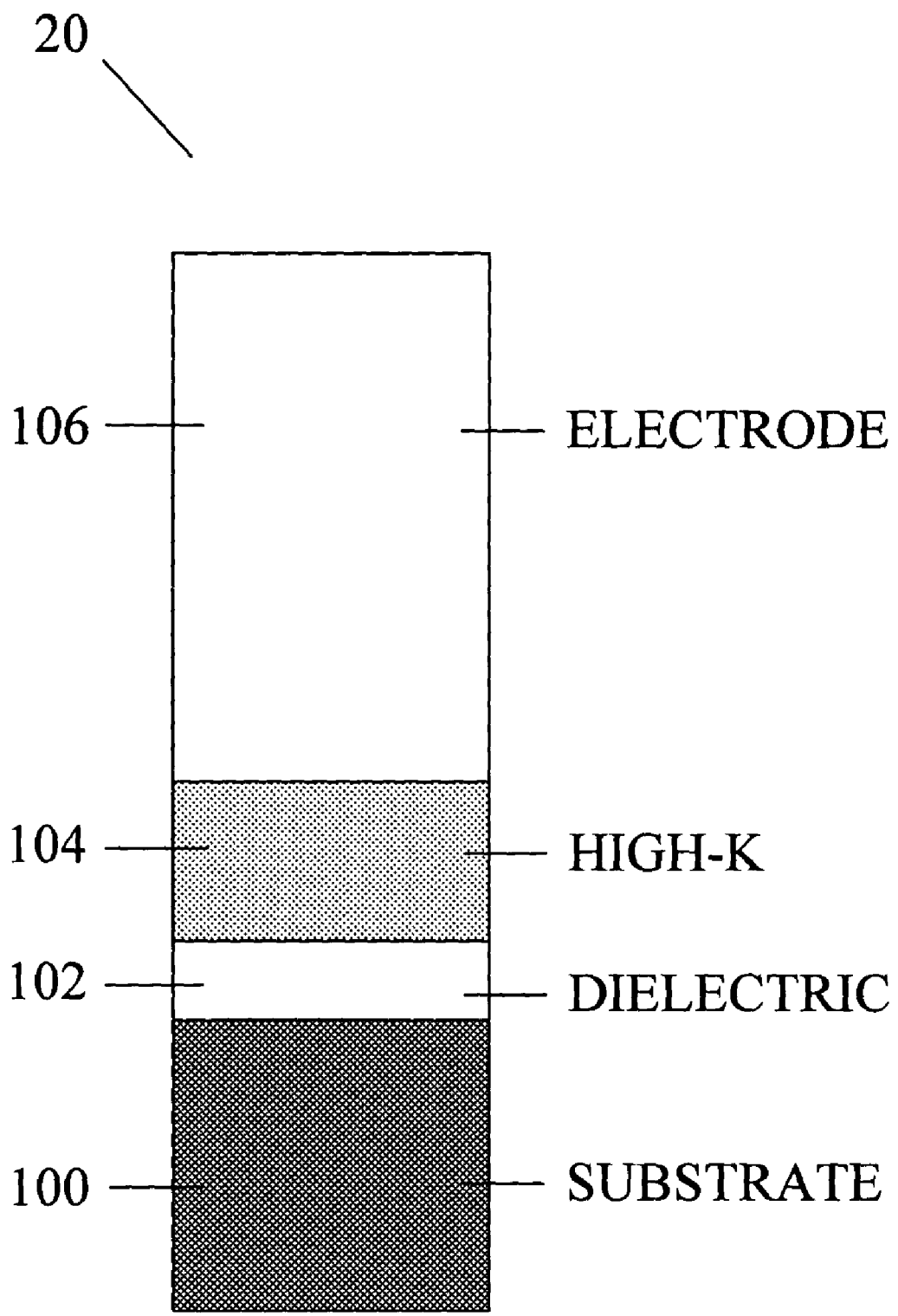
FIG. 1B schematically shows a cross-sectional view of an alternate gate electrode microstructure.

FIG. 1B schematically shows a cross-sectional view of an alternate gate electrode structure. The gate electrode structure 20 in FIG. 1B differs from the gate electrode structure in FIG. 1A by a relatively thick high-k layer 104 that is located between the electrode layer 106 and the dielectric layer 102. Dielectric materials featuring a dielectric constant greater than that of $SiO_2$ (k~3.9) are commonly referred to as high-k materials. In addition, high-k materials may refer to dielectric materials that are deposited onto substrates rather than grown on the surface of the substrate (e.g., $SiO_2$, $SiO_xN_y$). The high-k layer can, for example, be selected from one of $HfO_2$, $ZrO_2$, $Ta_2O_5$, $TiO_2$, $Al_2O_3$, and HfSiO. The high-k layer 104 in the gate electrode structure 20 can be physically thicker than the dielectric layer 102, while attaining the necessary capacitance.

Semiconductor transistor technology is currently requiring oxide and oxynitride layers that are less than about 10–15 A thick for conventional gate dielectric applications (FIG. 1A), or as thin as about 5–7 A for use as dielectric interface layers with high-k materials (FIG. 1B). In order to form ultra-thin oxynitride layers that are thinner (less than about 10 A) than an initial dielectric layer (e.g., an oxide layer, an oxynitride layer, or a nitride layer), can require removal of at least a portion of the initial dielectric layer prior to growing the oxynitride layers.

Figure 3A:
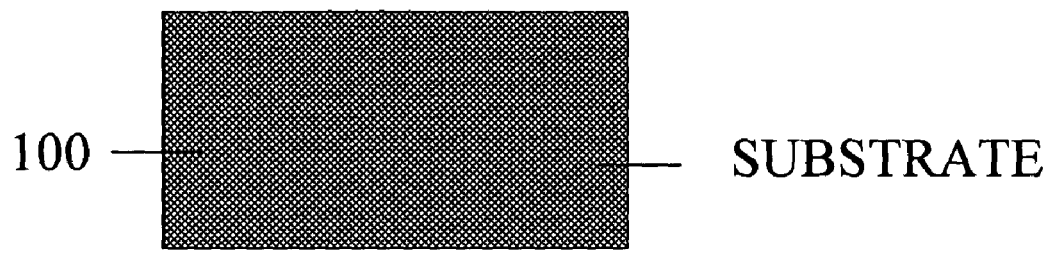
FIG. 3A schematically shows a cross-sectional view of a clean substrate.

FIG. 3A schematically shows a cross-sectional view of a clean substrate. A clean substrate is a substrate that does not have an oxide layer or an oxynitride layer. A substrate can be cleaned, for example, by placing it in a liquid bath containing dilute hydrofluoric acid (HF) or, alternatively, exposing it to HF gas phase etching. The dilute HF liquid solution can be a $H_2O$:HF (e.g., about 50:1) mixture. Following the HF cleaning process, the substrate can be rinsed in de-ionized (D.I.) water prior to the oxidation process.

Figure 3B:
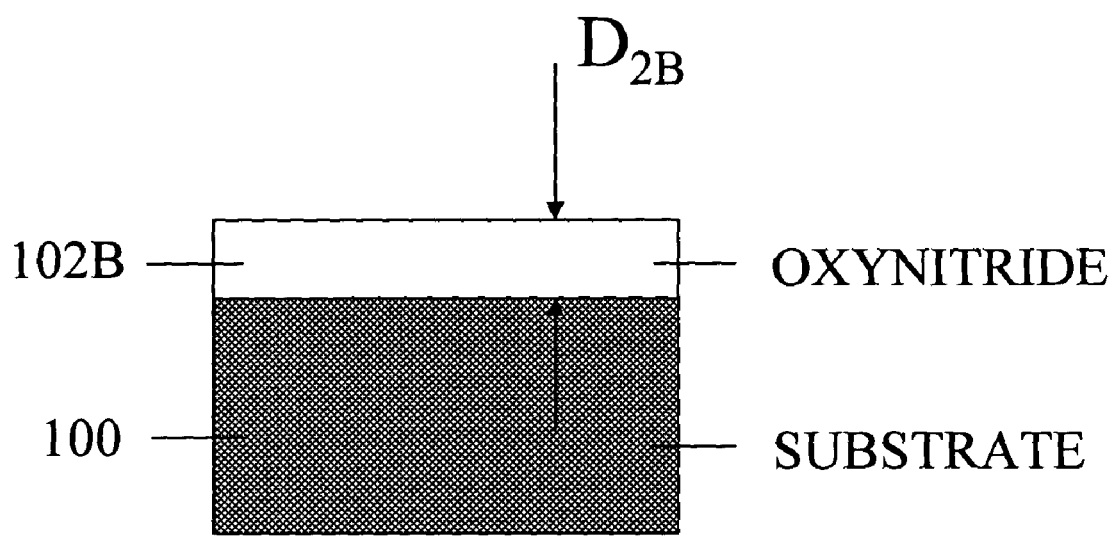
FIG. 3B schematically shows a cross-sectional view of an oxynitride layer grown by a self-limiting process according to an embodiment of the present invention.

FIG. 3B schematically shows a cross-sectional view of an oxynitride layer grown by a self-limiting process according to an embodiment of the present invention. The oxynitride layer 102B has a well-controlled thickness $D_{2B}$ that is uniform over the whole substrate 100. The ultra-thin oxynitride layer can be grown on the clean substrate 100 by a self-limiting process, where the oxynitride growth rate (and the resulting final oxynitride layer thickness) is carefully controlled by selecting the process conditions, particularly the partial pressures of a nitrogen-containing oxidizing gas in the process gas and in the process chamber, and the substrate temperature.

In the self-limiting process, the process gas can comprise a nitrogen-containing oxidizing gas containing at least one of NO, $N_2O$, and $NH_3$. In addition, the process gas can also contain an oxygen-containing gas (e.g., at least one of $O_2$, $O_3$, $H_2O$, and $H_2O_2$.). Following the formation of an oxynitride layer, the oxynitride layer can be post-annealed using a process gas comprising $N_2O$ or $O_2$, for example. Alternatively, the oxynitride layer can be post-treated in a plasma nitridation process using a process gas comprising at least one of $N_2$, NO, $N_2O$, and $NH_3$.

Suitable process conditions that enable self-limiting growth of an oxynitride layer with a desired thickness and thickness uniformity, can be determined by direct experimentation and/or design of experiments (DOE). For example, adjustable process parameters can comprise time, temperature (e.g., substrate temperature), process pressure, and composition of the process gas.

Figure 4:
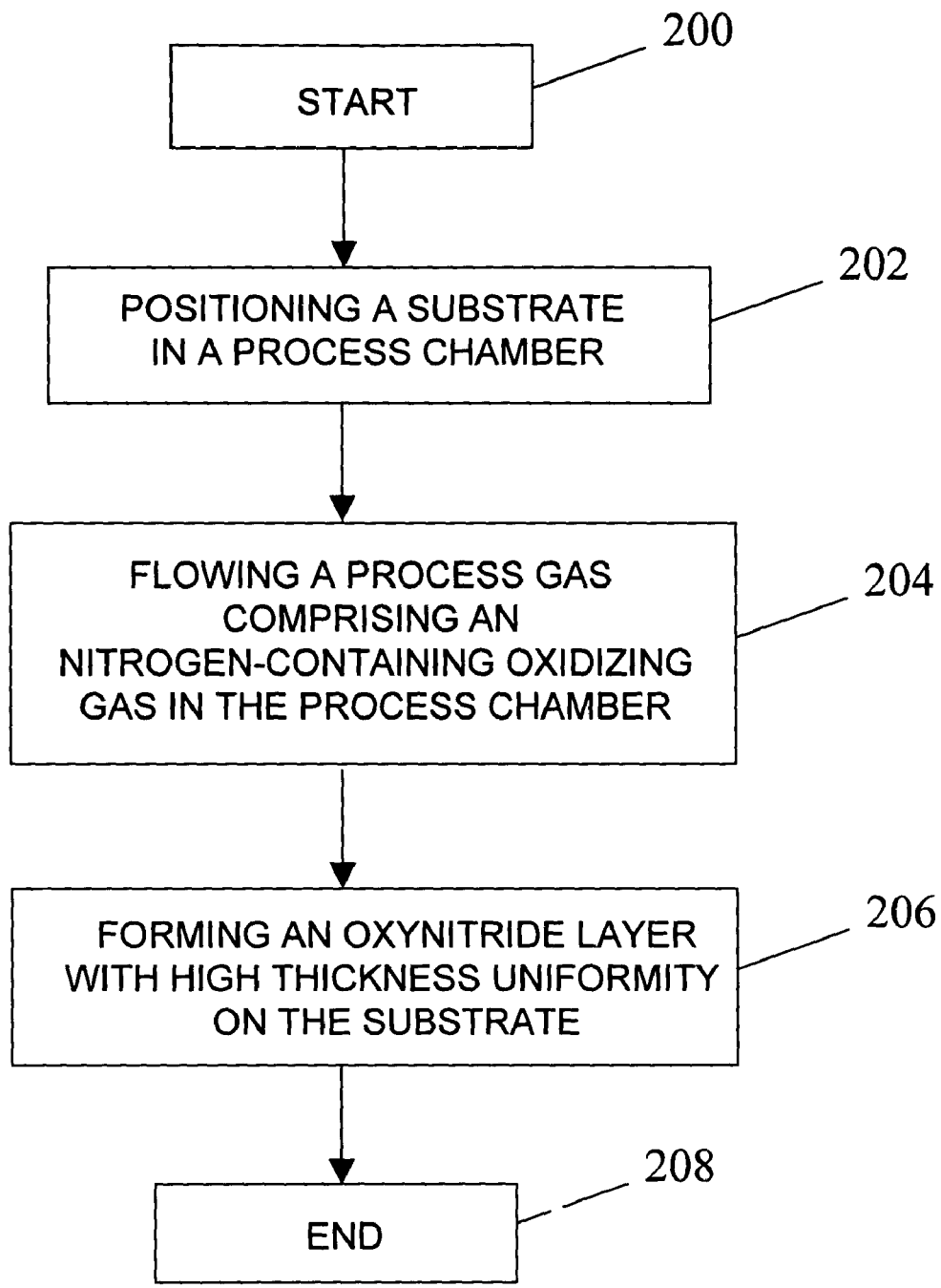
FIG. 4 shows a flowchart for forming an oxynitride layer according to an embodiment of the invention.

FIG. 4 shows a flowchart for forming an oxynitride layer according to an embodiment of the invention. At 200, the process is started. At 202, a substrate is positioned in a process chamber and the chamber is evacuated. At 204, a process gas comprising a nitrogen-containing oxidizing gas (e.g., NO $N_2O$, or $NH_3$), and optionally an oxygen-containing gas (e.g., $O_2$, $O_3$, $H_2O$, and $H_2O_2$), is flowed into the process chamber. At 206, an oxynitride layer is formed on the substrate in a self-limiting oxidation process. The substrate is processed for a time period that enables formation of the desired oxynitride layer, and the process ends at 208.

Figure 5A:
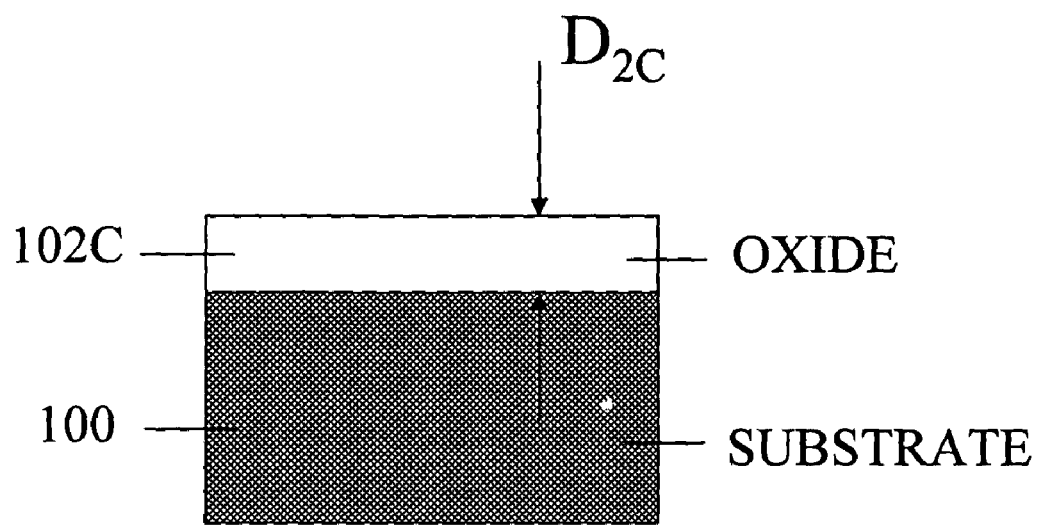
FIG. 5A schematically shows a cross-sectional view of an oxide layer overlying a substrate.

FIG. 5A schematically shows a cross-sectional view of an oxide layer overlying a substrate. The initial oxide layer 102C has a thickness $D_{2C}$ and can, for example, be an ultra-thin native oxide layer that is typically a few angstrom thick, and forms easily on surfaces of various clean substrates (e.g., Si), even at room temperature and atmospheric pressure. Alternatively, the initial oxide layer 102C can be a chemically deposited oxide layer formed by a self-limiting oxidation process. The initial oxide layer 102C can provide a starting growth layer for growing a thicker oxynitride layer with good thickness control and thickness uniformity.

Figure 5B:
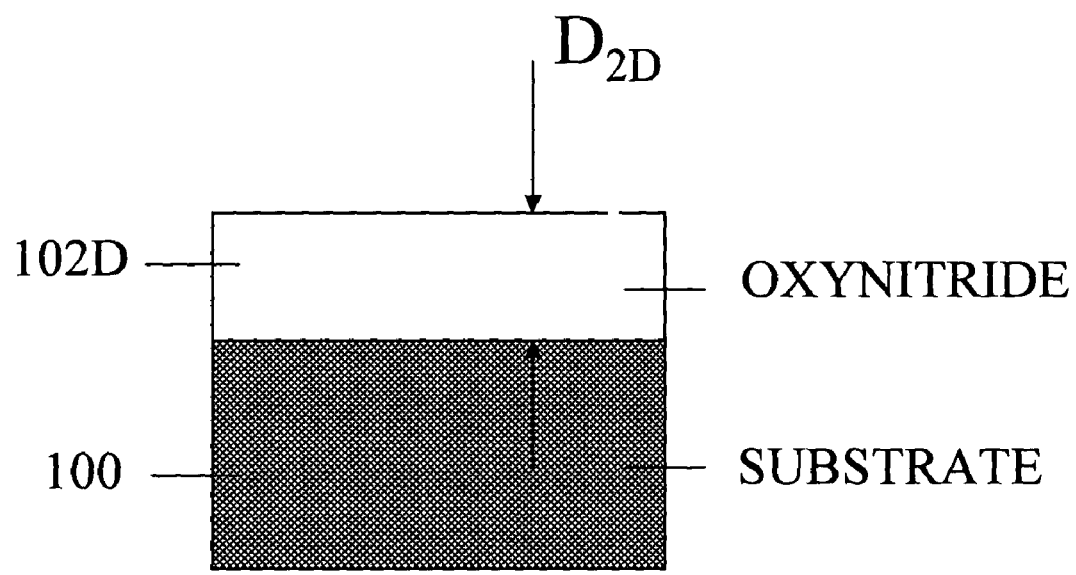
FIG. 5B schematically shows a cross-sectional view of an oxynitride layer grown by a self-limiting process according to an alternate embodiment of the invention.

FIG. 5B schematically shows a cross-sectional view of an oxynitride layer grown by a self-limiting process according to an alternate embodiment of the invention. The thickness $D_{2C}$ of the oxide layer 102C in FIG. 5A is less than the thickness $D_{2D}$ of the oxynitride layer 102D. Importantly, due to the self-limiting growth mechanism of the oxynitride layer 102D, it is not necessary for the initial oxide layer 102C to have good thickness uniformity, in order to grow an oxynitride layer 102D with good thickness uniformity.

Figure 6A:
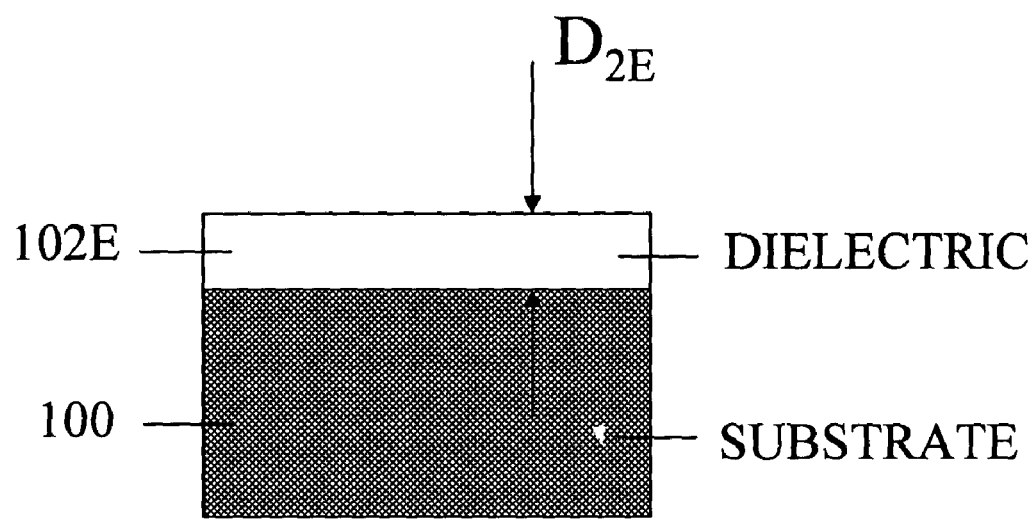
FIG. 6A schematically shows a cross-sectional view of a dielectric layer overlying a substrate.
Figure 6B:
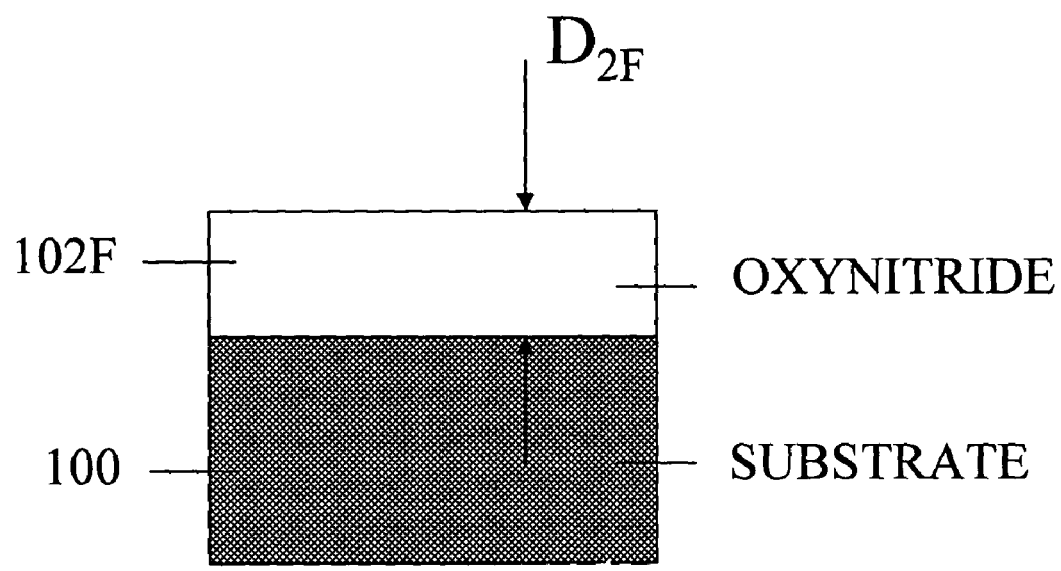
FIG. 6B schematically shows a cross-sectional view of an oxynitride layer grown by a self-limiting process according to an alternate embodiment of the invention.

FIG. 6A schematically shows a cross-sectional view of a dielectric layer overlying a substrate. The initial dielectric layer 102E can, for example, be an oxynitride layer or a nitride layer that is a few angstrom thick ($D_{2E}$). FIG. 6B schematically shows a cross-sectional view of an oxynitride layer 102F grown by a self-limiting process according to another embodiment of the invention. The initial oxynitride or nitride layer 102E in FIG. 6A is used to control the growth of an oxynitride layer 102F at the Si interface, where the thickness $D_{2F}$ of the oxynitride layer 102F is controlled by a self-limiting reaction of the substrate through the dielectric layer 102E. The resulting oxynitride layer 102F contains oxidized material from the reaction of the oxidizing species with the substrate 100 and with the dielectric layer 102E. The initial dielectric layer 102E, itself, can be formed in a self-limiting oxidation process.

Figure 7:
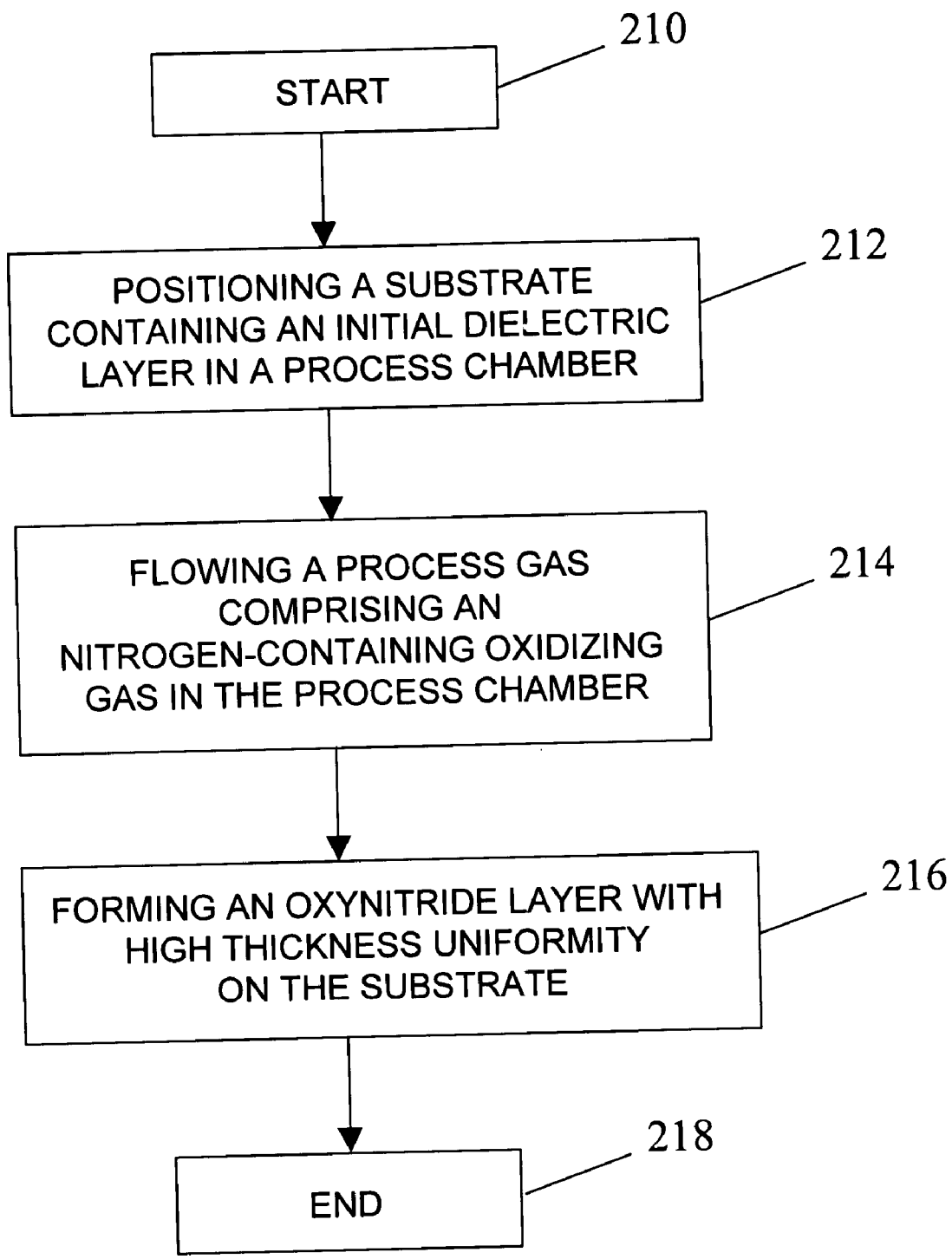
FIG. 7 shows a flowchart for forming an oxynitride layer according to an alternate embodiment of the invention.

FIG. 7 shows a flowchart for forming an oxynitride layer according to an alternate embodiment of the invention. At 210, the process is started. At 212, a substrate containing an initial dielectric layer is positioned in a process chamber and the chamber is evacuated. The initial dielectric layer can comprise at least one of an oxide layer, an oxynitride layer, or a nitride layer. A nitride layer can, for example, comprise a $SiN_x$ layer, formed using deposition of a $SiN_x$ material or nitridation of a Si layer. At 214, a process gas comprising a nitrogen-containing oxidizing gas and optionally an oxygen-containing gas, is flowed into the process chamber. At 216, an oxynitride layer is formed in self-limiting oxidation of the substrate. The substrate is processed for a time period that enables formation of the desired oxynitride layer, and the process ends at 218.

Figure 2A:
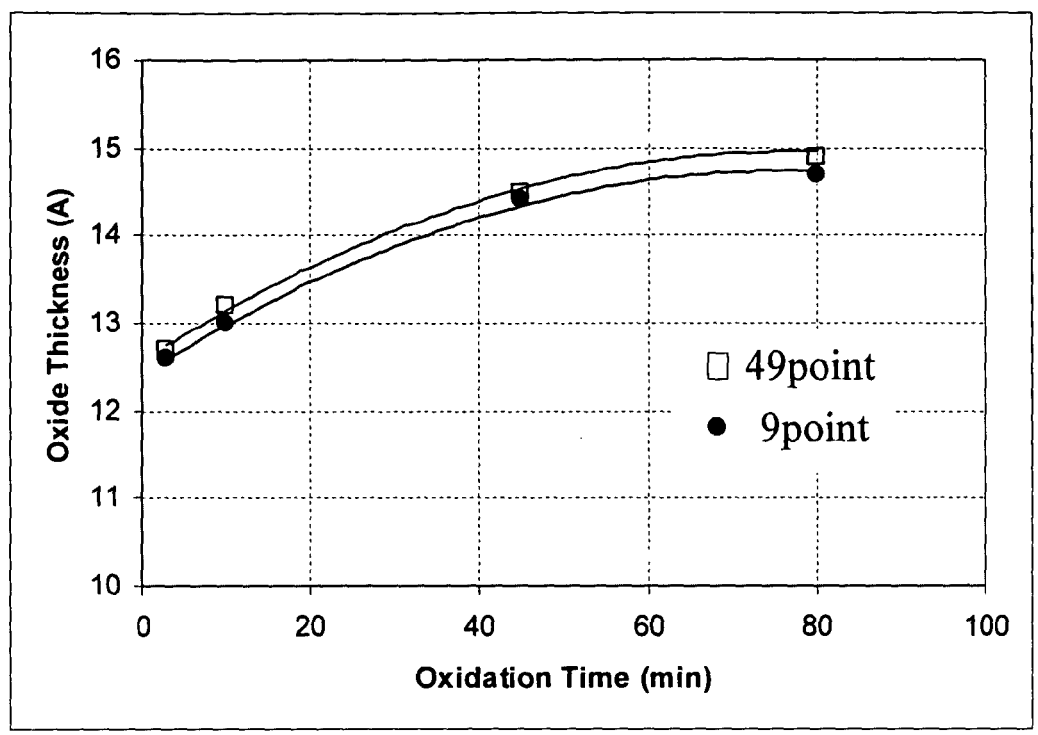
FIG. 2A shows oxide thickness versus oxidation time for oxide layers grown by a self-limiting process.

FIG. 2A shows oxide thickness versus oxidation time for oxide layers grown by a self-limiting process. The starting 200 mm Si substrates (wafers) in FIG. 2A, contained chemical oxide layers that were about 10 A thick. Self-limiting oxidation of the Si substrates containing the chemical oxide layers was carried out for 3 to 80 min under low-pressure conditions. The oxidation process utilized a process gas containing an about 3:1 $N_2:O_2$ gas mixture, a process chamber pressure of about 8 Torr, and a substrate temperature of about 700° C. Typical gas flows were about 3 slm $N_2$ and about 1 slm $O_2$ in a batch type process chamber for a 100 wafer batch of 200 mm wafers.

The oxidation curves in FIG. 2A show the average oxide thickness measured at 9 points (lower curve) and 49 points (upper curve) on the substrates using ellipsometry and a refraction index of 1.46. It is evident from FIG. 2A that the oxide growth saturates at an oxide thickness of about 15 A. At each measured oxidation time (3, 10, 45, 80 min), the oxide layer thickness varied by less than about 1 A for all 49 measurement points.

Figure 2B:
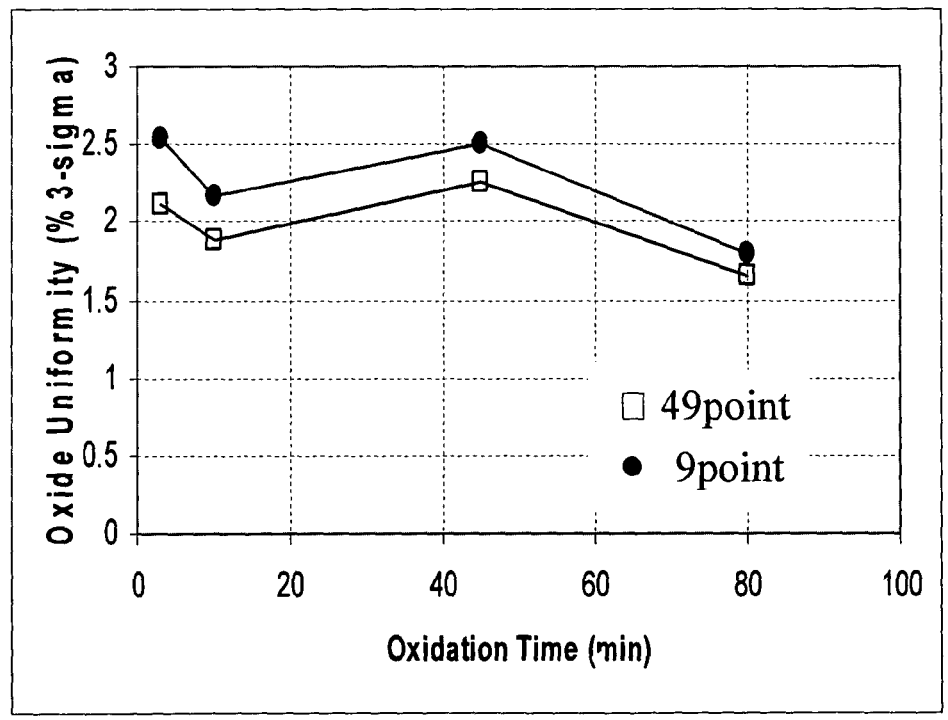
FIG. 2B shows oxide uniformity versus oxidation time for oxide layers grown by a self-limiting process.

FIG. 2B shows oxide uniformity versus oxidation time for oxide layers grown by a self-limiting process. The oxide thickness uniformity for the 9 point and 49 point measurements is shown as % 3-sigma values, and the overall trend shows improved oxide thickness uniformity over the whole Si substrate as the oxide layers grow thicker. Electrical measurements obtained for ultra-thin oxide layers (~15 A) shown in FIGS. 2A and 2B, showed good electrical properties when used as interface layers underneath high-k layers in gate electrode microstructures (see FIG. 1B).

The basic mechanism in a dry oxidation process is the diffusion of an oxidizing species through an existing dielectric layer (e.g., oxide, oxynitride, or nitride layer) and the reaction of the oxidizing species with the substrate at the oxide/substrate interface. In a self-limiting oxidation process, the rate of oxidation decreases as the thickness of the dielectric layer increases. This is likely due to hindered diffusion of the oxidizing species through the existing layer to the layer/substrate interface.

In mathematical terms, Fick's Law ($J=-D\times dC/dx$) describes the dependence of mass flux (J) through a layer, on the ratio of change in concentration (dC) to the change in layer thickness (dx), with a material constant diffusivity (D). The partial pressure of the oxidizing ambient is used to control the concentration gradient component, which in turn determines the final thickness of the layer given a fixed mass flux, which is at the limit of the oxidation potential (self-limited oxidation). In order to achieve properties of self-limiting oxidation, it is important that the oxidation ambient forms an oxidation barrier on the substrate. In FIG. 2A, only about 0.5 A of additional oxide growth is observed during the last 30 min of the 80 min self-limited process, and the self-limiting process leads to a more uniform oxide layer thickness.

In the self-limiting oxidation process, FIGS. 2A and 2B illustrate that substrate regions that contain a relatively thin oxide layer, grow slower than regions where the oxide layer is thicker. This leads to formation of oxide layers where the thickness of the oxide layer is uniform over the whole substrate, whether the initial oxide layer is uniform or not. We believe that the slow oxide growth rate that is observed in FIGS. 2A and 2B, advantageously permits long oxidation/anneal times, and improves the electrical quality of the resulting oxide layer, by removing bulk and interface traps, when a saturated, fully oxidized, stable oxide layer is formed.

In a self-limiting oxidation process for forming oxynitride layers, the oxynitride growth rate (and the resulting final oxynitride layer thickness) can be reduced/increased by decreasing/increasing the partial pressure of the nitrogen-containing oxidizing gas in the process chamber. A low partial pressure of the nitrogen-containing oxidizing gas allows controlled growth of thin oxynitride layers. The partial pressure of the nitrogen-containing oxidizing gas can, for example, be less than about 10 Torr. In an alternate embodiment, the partial pressure of the nitrogen-containing oxidizing gas can be less than about 5 Torr. In addition, the growth rate of the oxynitride layer can be reduced/increased by lowering/increasing the substrate temperature. The pressure of the processing chamber can be less than atmospheric pressure. Alternatively, the process chamber pressure can be less than about 50 Torr.

The oxidation data whose results are illustrated in FIGS. 2A and 2B, illustrates that it is possible to reproducibly grow oxide layers that are about 15 A thick, with excellent uniformity, from substrates containing oxide layers that are a few angstrom thick. The ability to start with substrates that contain an initial oxide layer (e.g., a chemical or native oxide), can remove the need to strip the initial oxide layer, prior to growing an oxynitride layer on a clean substrate, as long as the initial oxide thickness is less than the desired final oxynitride thickness.

In the aforementioned process example described in FIGS. 2A and 2B, the process gas comprised $O_2$ gas and $N_2$ inert gas. In a self-limiting process to grow oxynitride layers the nitrogen-containing oxidizing gas in process gas can, for example, comprise at least one of NO, $N_2O$, and $NH_3$. In addition, the process gas can further contain an oxygen-containing gas (e.g., at least one of $O_2$, $O_3$, $H_2O$, and $H_2O_2$). Furthermore, the process gas can contain an inert gas. The inert gas can comprise at least one of Ar, He, Ne, Kr, Xe, and $N_2$. The addition of an inert gas to the process chemistry is, for example, to dilute the process gas or adjust the process gas partial pressure(s).

The parameter space for the oxidation process can, for example, utilize a process gas flow rate less than about 2000 sccm, an inert gas flow rate less than about 1000 sccm, and a substrate temperature from about 500° C. to about 1000° C. For example, the substrate temperature can be about 700° C. A partial pressure of a nitrogen-containing oxidizing gas can, for example, be less than about 10 Torr. In an alternate embodiment, the partial pressure of a nitrogen-containing oxidizing gas can be less than about 5 Torr. The substrate temperature can be held constant during the oxidation process or, alternatively, the substrate temperature can be ramped during the process. The chamber pressure can be below atmospheric pressure. Alternatively, the chamber pressure can be less than 50 Torr.

A processing system for forming ultra-thin oxynitride layers can comprise a batch type process chamber capable of processing multiple substrates (wafers) simultaneously. Alternatively, the processing system can comprise a single wafer process chamber. The process chamber can process substrates of any diameter, such as substrates having a diameter greater than about 195 mm, e.g., 200 mm substrates, 300 mm substrates, or even larger substrates. A batch type process chamber can provide an advantage over single wafer process chambers by allowing long processing times for self-limiting processes.

Figure 8:
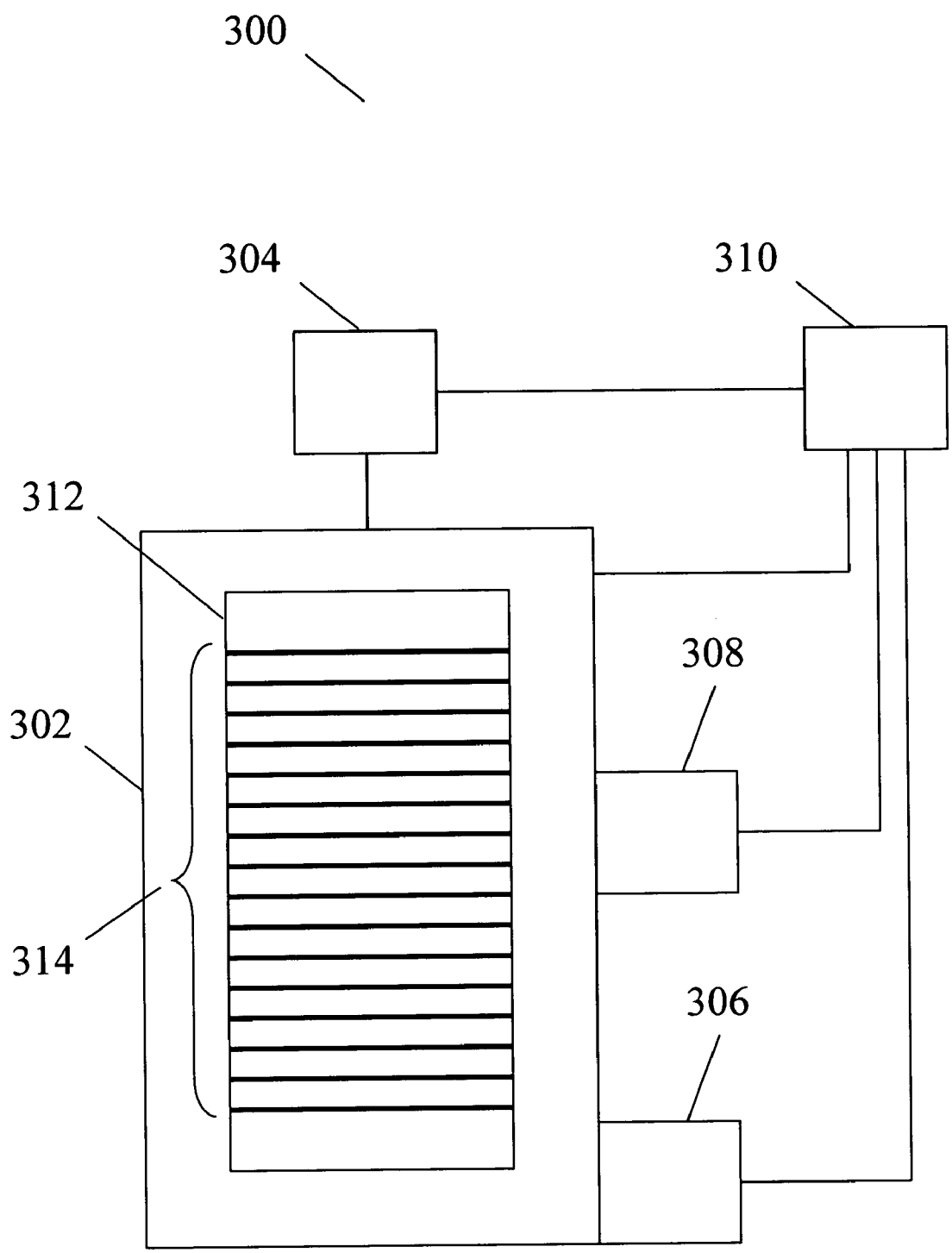
FIG. 8 shows a simplified block diagram of a processing system for forming oxynitride layers.

FIG. 8 shows a simplified block diagram of a processing system for forming oxynitride layers. The batch type processing system 300 comprises a process chamber 302, a gas injection system 304, a vacuum pumping system 306, a process monitoring system 308, and a controller 310. The gas injection system 304 is used to introduce a process gas for purging and processing the substrates 306. Multiple substrates 314 can be loaded into the process chamber 302 and processed using substrate holder 312.

When carrying out a self-limiting process, it can be advantageous to load the substrates (wafers) to be processed into a process chamber 302 that is at a temperature below which wafer oxidation occurs. A typical process according to the invention can comprise loading the wafers to be processed into a batch type process chamber that is at a temperature of about 300° C. and comprises an ambient containing about 1% oxygen. These process conditions are effective in removing organic contamination from the substrates. In addition, several pump/purge cycles can be performed using an inert gas. Next, the process chamber temperature and process chamber pressure are adjusted to the desired values in an inert ambient to avoid substrate oxidation under non-equilibrium conditions. When the process temperature is reached, the substrates are exposed to a process gas for a time period that results in formation of the desired oxynitride layer. At the end of the oxidation process, the process chamber can be evacuated and purged with an inert gas, and the substrates removed from the process chamber.

The process can be controlled by a controller 310 capable of generating control voltages sufficient to communicate and activate inputs of the processing system 300 as well as monitor outputs from the processing system 300. Moreover, the controller 310 can be coupled to and exchange information with process chamber 302, gas injection system 304, process monitoring system 308, and vacuum pumping system 306. For example, a program stored in the memory of the controller 310 can be utilized to control the aforementioned components of the processing system 300 according to a stored process recipe. One example of controller 310 is a DELL PRECISION WORKSTATION 610™, available from Dell Corporation, Dallas, Tex.

Real-time process monitoring can be carried out using process monitoring system 308 during processing. For example, mass spectroscopy (MS) can provide qualitative and quantitative analysis of the gaseous chemical species in the process environment. Process parameters that can be monitored using MS include gas flows, gas pressure, ratios of gaseous species, and gas purities. These parameters can be correlated with prior process results and various physical properties of the oxynitride layers.

It should be understood that various modifications and variations of the present invention may be employed in practicing the invention. It is therefore to be understood that, within the scope of the appended claims, the invention may be practiced otherwise than as specifically described herein.

The invention claimed is:

1. A method of forming a semiconductor microstructure, the method consisting essentially of:
   positioning a substrate in a process chamber;
   flowing a process gas comprising a nitrogen-containing oxidizing gas in the process chamber;
   forming an oxynitride layer on the substrate, the oxynitride layer being formed in a self-limiting, thermal oxidation process, wherein the partial pressure of the nitrogen-containing oxidizing gas in the process chamber is less than about 10 Torr; and
   depositing a high-k layer on the oxynitride layer.

2. The method according to claim 1, wherein the thickness of the oxynitride layer is less than about 15 A.

3. The method according to claim 1, wherein the thickness of the oxynitride layer is less than about 10 A.

4. The method according to claim 1, wherein the thickness uniformity of the oxynitride layer varies less than about 1 A over the substrate.

5. The method according to claim 1, wherein the substrate diameter can be greater than about 195 mm.

6. The method according to claim 1, wherein the partial pressure of the nitrogen-containing oxidizing gas in the process chamber is less than about 5 Torr.

7. The method according to claim 1, wherein the nitrogen-containing oxidizing gas comprises at least one of NO, $N_2O$, and $NH_3$.

8. The method according to claim 1, wherein the process gas further comprises an oxygen-containing gas.

9. The method according to claim 8, wherein the oxygen-containing gas comprises at least one of $O_2$, $O_3$, $H_2O$, and $H_2O_2$.

10. The method according to claim 1, wherein the process gas further comprises an inert gas.

11. The method according to claim 10, wherein the inert gas comprises at least one of Ar, He, Ne, Kr, Xe, and $N_2$.

12. The method according to claim 1, wherein the substrate temperature is between about 500° C. and about 1000°C.

13. The method according to claim 1, wherein the substrate temperature is about 700°C.

14. The method according to claim 1, wherein the substrate comprises Si and the oxynitride layer comprises $SiO_xN_y$.

15. The method according to claim 1, further comprising exposing the oxynitride layer to a plasma nitridation process.

16. The method according to claim 15, wherein the plasma nitridation process utilizes a process gas comprising at least one of $N_2$, NO, $N_2O$, and $NH_3$.

17. The method according to claim 1, further comprising post-annealing the oxynitride layer using a process gas comprising at least one of $N_2O$ and $O_2$.

18. The method according to claim 1, wherein the positioning comprises positioning a substrate containing an initial dielectric layer in a process chamber.

19. The method according to claim 18, wherein the initial dielectric layer is formed in a self-limiting oxidation process.

20. The method according to claim 18, wherein the initial dielectric layer comprises at least one of an oxide layer, an oxynitride layer, and a nitride layer.

21. The method according to claim 20, wherein the oxide layer comprises $SiO_2$, the oxynitride layer comprises $SiO_xN_y$, and the nitride layer comprises $SiN_x$.

22. The method according to claim 1, wherein the processing chamber pressure is below atmospheric pressure.

23. The method according to claim 22, wherein the processing chamber pressure is less than about 50 Torr.

24. A microstructure consisting essentially of:
a substrate;
an oxynitride layer on the substrate, the oxynitride layer being formed in a self-limiting oxidation process in a process chamber, wherein the partial pressure of a nitrogen-containing oxidizing gas in the process chamber is less than about 10 Torr; and
a high-k layer deposited on the oxynitride layer.

25. The microstructure according to claim 24, wherein the thickness of the oxynitride layer is less than about 15 A.

26. The microstructure according to claim 24, wherein the thickness of the oxynitride layer is less than about 10 A.

27. The microstructure according to claim 24, wherein the high-k layer comprises at least one of $HfO_2$, $ZrO_2$, $Ta_2O_5$, $TiO_2$, $Al_2O_3$, and HfSiO.

28. The microstructure according to claim 24, further comprising:
an electrode layer on the high-k layer.

29. The microstructure according to claim 28, wherein the electrode layer comprises at least one of W, Al, TaN, TaSiN, HfN, HfSiN, TiN, TiSiN, Re, Ru, and SiGe.

30. The method according to claim 1, further comprising: depositing an electrode layer on the high-k layer.

* * * * *